United States Patent [19]

Hayakawa

[11] Patent Number: 4,808,943
[45] Date of Patent: Feb. 28, 1989

[54] SWITCHING CIRCUIT OF AMPLIFIER OUTPUT

[75] Inventor: Tatsuo Hayakawa, Tokyo, Japan

[73] Assignee: NEC Corporation, Tokyo, Japan

[21] Appl. No.: 154,154

[22] Filed: Feb. 9, 1988

[30] Foreign Application Priority Data

Feb. 9, 1987 [JP] Japan .................................. 62-28508

[51] Int. Cl.[4] .............................................. H03F 1/34
[52] U.S. Cl. ........................................ 330/51; 330/110
[58] Field of Search ................. 330/51, 110; 307/240, 307/242, 243, 253; 363/71, 72

[56] References Cited

U.S. PATENT DOCUMENTS 4,410,855 10/1983 Underhill et al. .............. 307/353 X Primary Examiner—James B. Mullins
Attorney, Agent, or Firm—Helfgott & Karas

[57] ABSTRACT

A switch circuit includes an input terminal, an output terminal, an amplifier having a non-inverting input node connected to the input terminal, an inverting input node and an output node, and a feedback circuit having a feedback path feeding a signal at the output node back to the inverting input node, a switch circuit being inserted in the feedback path and the output terminal being connected to the feedback path.

4 Claims, 2 Drawing Sheets

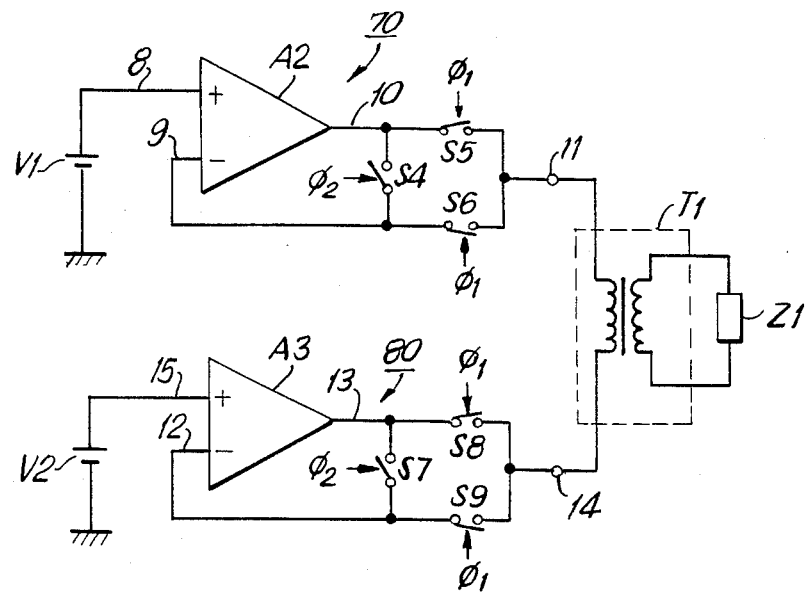
FIG.4
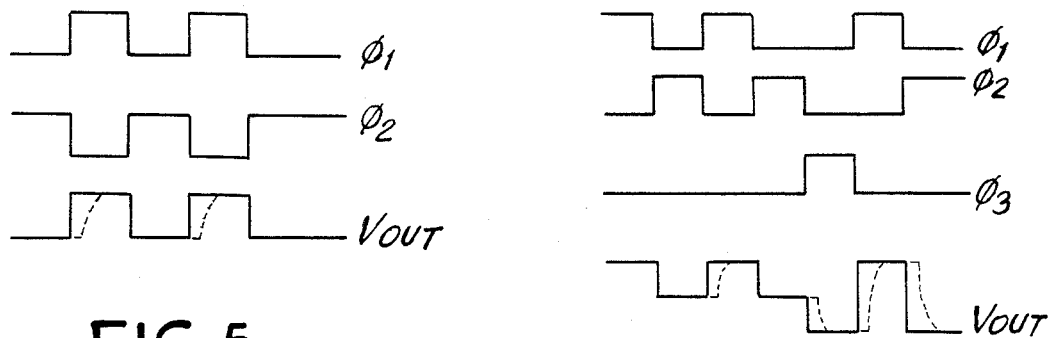
FIG.5
FIG.7
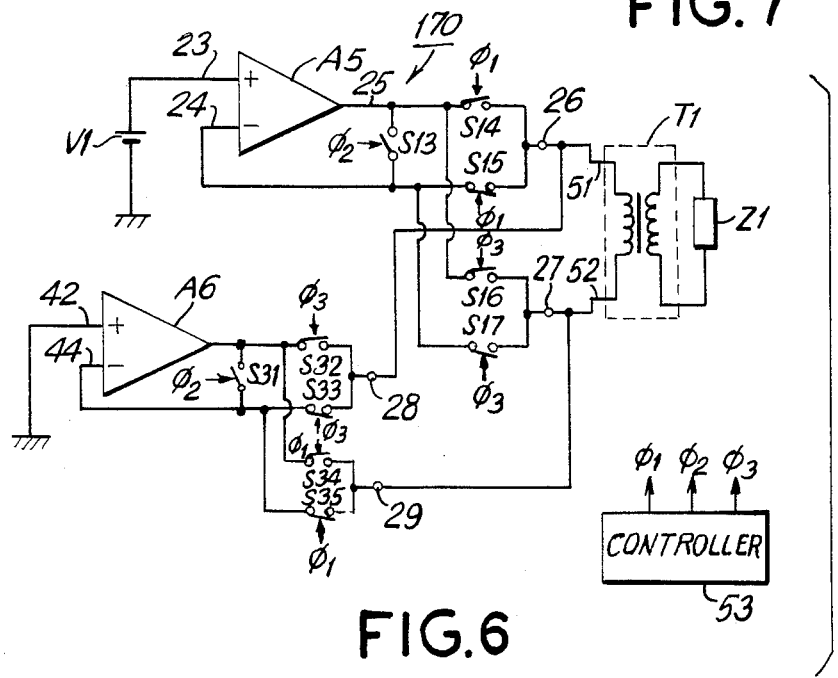
FIG.6

SWITCHING CIRCUIT OF AMPLIFIER OUTPUT

BACKGROUND OF THE INVENTION

1. Field of the Invention:

This invention relates to a switching circuit of an output from an amplifier, and more specifically to the switching circuit of an output from an amplifier of which output gain is controlled by a negative feedback.

2. Description of the Related Art:

An amplifier having a negative feedback has an output gain controlled by the negative feedback. However, when the output controlled by the negative feedback is applied to a load through a switch, the output voltage obtained across the load decreases by a voltage drop across the switch. Especially, in a semiconductor integrated circuit, the switch is formed by one or more transistors. One example of the switch is a transfer gate in which P-and N-channel MOS field effect transistors are connected in parallel with each other. Such transfer gate or other transistor switch has 10 to 100 ohms of ON-resistance. The ON-resistance causes the voltage drop across the switch. The voltage drop across the switch is serious when the load has a small impedance comparative to the ON-resistance.

The ON-resistance of the transfer gate or other transistor switch may be decreased by increasing the size of the transistor used therein. This measure, however, accompanies an increment of chip area of the semiconductor integrated circuit, resulting in rising a production cost, decreasing a production yield, lowering an integration density and other drawbacks.

SUMMARY OF THE INVENTION

It is a major object of the present invention to provide a switching circuit of an amplifier producing an output voltage across a load with a gain precisely controlled by a feedback means in the amplifier.

According to the present invention, there is provided a switching circuit including an input terminal, an output terminal, an amplifier having a non-inverting input node coupled to the input terminal, an inverting input node and an output node, and a feedback circuit having a feedback path feeding a signal at the output node back to the inverting input node, a switch means inserted in the feedback path, and the output terminal being connected to the feedback path. More particularly, the switching circuit according to the present invention includes an amplifier having a non-inverting input node receiving an input signal, an inverting input node and an output node, an output terminal connected with a load, a circuit point, a first switch connected between the output node and the circuit point, a second switch connected between the output node and the output terminal, a third switch connected between the output terminal and the circuit point, a circuit means connected between the circuit point and the inverting input node for feeding back a signal at the output node to the inverting input, and a control means for controlling the switching operations of the first, second and third switches under an opposite relationship between the on-and-off condition of the first switch and the on-and-off conditions of the second and third switches.

The switching circuit of the present invention produces an output voltage at the load by turning the first switch off and the second and third switches on, respectively. In this condition, the first and second switches are included in a feedback loop. Only the ON-resistance of the third switch affect the output voltage at the load, but the effect of the ON-resistance to the output voltage is very small as explained with reference to the embodiments of the present invention. Thus, the switch can be made with a small transistor in a semiconductor integrated circuit to make possible a use of a small chip for the semiconductor integrated circuit, resulting in lowering a production cost, increasing a production yield, rising an integration density and so on.

BRIEF DESCRIPTION OF THE DRAWINGS

The above-mentioned and other objects, features and advantages of the invention will become more apparent from the following description taken in conjunction with the accompanying drawings:

FIG. 4 is a circuit diagram showing a switching circuit according to a third embodiment of the present invention;

FIG. 5 is a timing chart showing switch control pulses $\phi_1$ and $\phi_2$ and an output pulses relating to the first, second and third embodiments of the present invention;

FIG. 6 is a circuit diagram showing a switch circuit according to a fourth embodiment of the present invention; and FIG. 7 is a timing chart showing switch control pulses $\phi_1$, $\phi_2$ and $\phi_3$ and an output pulses relating to the fourth embodiment of the present invention.

Figure 1:
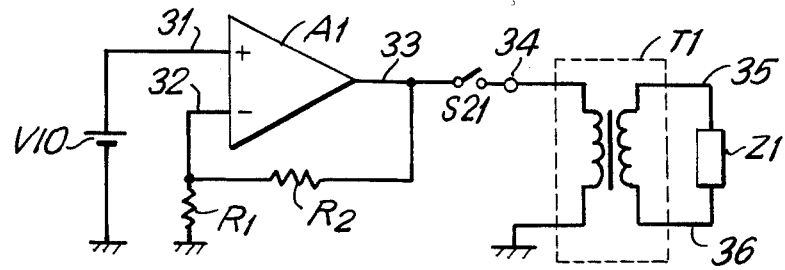
FIG. 1 is a circuit diagram of a switching circuit in the prior art.

A switching circuit in the prior art inserted a switch S21 between an amplifier composed of an operational amplifier A1 and feedback resistors $R_1$ and $R_2$ and a load composed of a transfer T1 and a load impedance Z1, as shown in FIG. 1. The gain of the amplifier is determined by the feedback resistors $R_1$ and $R_2$. An input signal V10 applied to an non-inverting input node 31 is amplified by the operational amplifier A1 with the gain determined by the feedback resistors $R_1$ and $R_2$ to be obtained as an output signal at the output node 33. The output signal is applied to the transformer T1 through the switch S21 and then generated at the load impedance Z1 connected between both ends 35 and 36 of the secondary winding of the transformer T1.

The switch S21 is a transfer gate in a semiconductor integrated circuit. The transfer gate is formed of P- and N-channel MOS FETs of which source-drain paths are connected in parallel with each other. The P- and N-channel MOS FETs have 10 to 100 ohms of ON-resistances when they are in a conductive condition. The input resistance of the transformer T1/is also small value such as several hundreds ohms. Therefore, the voltage drop across the switch S21 is a considerable value and fluctuates in accordance with variation in the ON-resistances of the MOS FET's which are affected by deviation of production condition. The output voltage obtained across the load impedance Z1 decreased by the ON-resistance of the switch S21. Furthermore, the decrement of the output voltage fluctuates in accordance with the deviation of the production condition and cannot be estimated when the circuit is designed.

DETAILED DESCRIPTION OF THE PREFERRED EMBODIMENTS

Figure 2A:
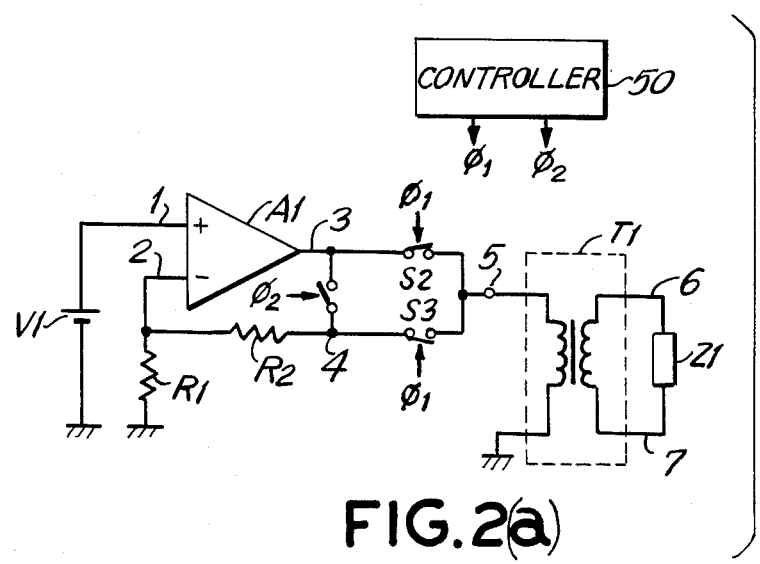
FIG. 2(a) is a circuit diagram showing a switching circuit according to a first embodiment of the present invention and FIG. 2(b) is a circuit diagram showing a transfer gate using as a switch in the embodiments of FIG. 2(a) and other drawings.
Figure 2B:
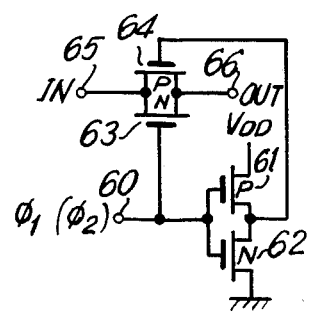

A first preferred embodiment of the present invention is shown in FIG. 2(a) and FIG. 2(b). An operational amplifier $A_1$ has a non-inverting input node 1 receiving an input reference voltage V1 of 1 volt, for example, an inverting input node 2 and an output node 3. A feedback resistor R1 of 5 KΩ, for example, is connected between a grounding point and the inverting input node 2. Another feedback resistor R2 of 5 KΩ, for example, is connected between the inverting input node 2 and a circuit point 4. A switch S1 is inserted between the output node 3 and the circuit point 4. A switch S2 is inserted between the output node 3 and an output terminal 5. A switch S3 is inserted between the output terminal 5 and the circuit point 4. The switch S1 is controlled by a switch control pulse $\phi_2$ applied from a controller 50, while the switches S2 and S3 are controlled by another switch control pulse $\phi_1$ applied from the controller 50. The phases of the switch control pulses $\phi_1$ and $\phi_2$ are kept in opposite phases to each other. The relationship between the switch control pulses $\phi_1$ and $\phi_2$ is shown in FIG. 5. Therefore, in an outputting condition, a feedback circuit is formed of the switches S2 and S3 and the feedback resistors R1 and R2, while, in a non-outputting condition, the feedback circuit is formed by way of the switch S1. The output signal obtained at the output terminal 5 is applied to a primary winding of a transformer T1 and then to a load impedance Z1 connected between both ends 6 and 7 of the secondary winding of the transformer T1.

The switches S1, S2 and S3 are transfer gates shown in FIG. 2(b). Between an input node 65 and an output node 66, paths between source and drain of N- and P-channel MOS FET's 63 and 64 are connected in parallel. A switch control pulse $\phi_1$ or $\phi_2$ is directly applied to a gate of the N-channel MOS FET 63 and is applied to a gate of the P-channel MOS FET 64 through an inverter in which P- and N-channel MOS FET's 61 and 62 are connected in series. Other types of transistor switches may be used for the switches S1, S2 and S3. In MOS IC's, the transfer gate using the P- and N-channel MOS FET's are most preferable one.

The output from the operational amplifier $A_1$ is generated at the output terminal 5 by turning the switches S2 and S3 on and the switch S1 off. The output waveform across the load impedance Z1 is shown in FIG. 5 by solid line. The dotted line of the output waveform is a case of omitting the switch S1. In such case, the output at the output node 3 rises up to a power voltage in response to turning the switches S2 and S3 off, because the operational amplifier A1 loses a feedback loop. Thereafter, when the switches S2 and S3 turn on, the amplifier A1 spends a time to recover the feedback condition, causing a deformation of rising shape of the output waveform. In other words, the switch S1 keeps a high speed response of the output signal.

In the outputting condition, the switches S2 and S3 are included in the feedback loop. The output voltage V0 at the output terminal 5 can be expressed as the following equation (1):

$$V_0 = V_1 \frac{R_1 + R_2 + R_{sw3}}{R_1} = V_1 \frac{R_1 + R_2}{R_1} + V_1 \frac{R_{sw3}}{R_1} \quad (1)$$

where $V_1$ denotes an input reference voltage, $R_1$ and $R_2$ being resistances of the feedback resistors $R_1$ and $R_2$ and $R_{sw3}$ being an on-resistance of the switch SW3. The deviation of the output voltage V0 from the value determined by the feedback resistors $R_1$ and $R_2$ is $$V_1 \frac{R_{sw3}}{R_1}.$$

The on-resistance $R_{sw3}$ is usually about 50 ohms and is very small, compared to the resistance $R_1$ of 5 KΩ. Therefore, the deviation of the output voltage from the value determined by the feedback resistors $R_1$ and $R_2$ is negligible. The output voltage V0 at the output terminal is determined by the feedback resistors $R_1$ and $R_2$, irrespective of the fluctuation of the on-resistance of the switches S1, S2 and S3 due to deviation of production condition. The on-resistances of MOS FET's are sufficiently small, compared to the resistance of the feedback resistor R1, without enlarging the MOS FET size. The use of three transistor switches does not enlarge the chip area required for the semiconductor integrated circuit.

Figure 3:
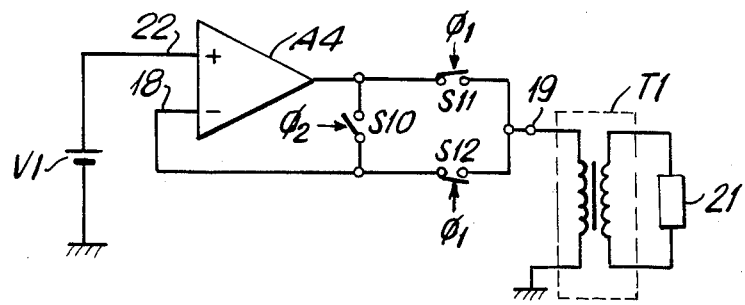
FIG. 3 is a circuit diagram showing a switching circuit according to a second embodiment of the present invention.

A second preferred embodiment shown in FIG. 3 is a case of a voltage follower type. An input reference voltage V1 is applied to a non-inverting input node 22 of an operational amplifier A4 of which output node 17 is connected to an inverting input node 18 through a parallel path of a switch S10 and two series switches S11 and S12 without using any resistor. An output terminal 19 at the junction between the switches S11 and S12 is connected to a load impedance Z1 through a transformer T1. The switch S10 and the switches S11 and S12 are respectively formed by a MOS transfer gate shown in FIG. 2(b) and controlled by switch control pulses $\phi_2$ and $\phi_1$ having opposite phases and being generated by the controller 50 shown in FIG. 2(a).

The amplifier of this second embodiment has a loop gain of "1", similar to a voltage follower circuit. Other operation is same as the first embodiment shown in FIG. 2(a). Also the same advantageous merits as the first embodiment can be obtained in this second embodiment. The affection of the on-resistances of the switch S12 and other switches in the feedback loop of the voltage follower circuit to the output voltage is reduced by a value divided by a gain of the operational amplifier A4. Therefore, the deviation of the output voltage at the output terminal 19 from the output voltage at the output node 17 is very small.

A third embodiment shown in FIG. 4 uses two switching circuits used in FIG. 3. A first switching circuit 70 includes a first reference voltage V1 applied to a non-inverting input 8 of an operational amplifier A2 of which output node 10 is connected to an inverting input node 9 through two parallel paths of a switch S4 and two series switches S5 and S6. A second switch circuit 80 includes a second reference voltage V2 applied to a non-inverting input of an operational amplifier A3 of which output node 13 is connected to an inverting input node 12 through two parallel paths of a switch S7 and two series switches S8 and S9. A primary winding of a transformer T1 is connected between a first output terminal 11 at a junction between the switches S5 and S6 and a second output terminal 14 at a junction between the switches S8 and S9. A load impedance Z1 is connected to a secondary winding of the transformer T1.

All the switches S4 to S9 are MOS transfer gates shown in FIG. 2(b). The switches S5, S6, S8 and S9 are controlled by a switch control pulse $\phi_1$, while the switches S4 and S7 are controlled by a switch control pulse $\phi_2$ having a phase opposite to the switch control pulse $\phi_1$. The switch control pulses $\phi_1$ and $\phi_2$ are generated by a controller 50 shown in FIG. 2(a).

An output voltage having a difference between the first and second reference voltages V1 and V2 is applied to the primary winding of the transformer T1 by turning the switches S5, S6, S8 and S9 on and the switches S4 and S7 off. Respective output voltages at the first and second output terminals 11 and 14 have small deviations from the first and second reference voltages V1 and V2 by on-resistances of the switches S6 and S9. These deviations are cancelled by applying the output voltages to the primary winding of the transformer 1. Therefore, a very precisely controlled output voltage can be obtained.

A fourth embodiment of the present invention of FIGS. 6 and 7 uses two switching circuits and is arranged so as to control a polarity of output signal. A first switching circuit 170 includes a first operational amplifier A5 and five switches S13 to S17. A reference voltage V1 is applied to a non-inverting input node 23 of the operational amplifier A5. An output node 25 of the operational amplifier A5 is connected to three parallel paths of a switch S13, two series switches S14 and S15 and two series switches S16 and S17. A first output terminal 26 at a junction of the switches S14 and S15 is connected to one end 51 of a primary winding of a transformer T1. A second output terminal 27 at a junction of the switches S16 and S17 is connected to the other end 52 of the primary winding of the transformer T1. A second switching circuit 180 includes a second operational amplifier A6 and five switches S31 and S35. A non-inverting input node 42 of the operational amplifier A6 is grounded. An output node 43 of the operational amplifier A6 is connected to three parallel paths of a switch S31, two series switches S32 and S33 and two series switches S34 and S35. A third output terminal 28 at a junction between the switches S32 and S33 is connected to the one end 51 of the primary winding of the transformer T1 together with the first output terminal 26. A fourth output terminal 29 is connected to the other end 52 of the primary winding of the transformer T1 together with the second output terminal 27. A load impedance Z1 is connected between both ends of a secondary winding of the transformer T1.

The switches S14, S15, S34 and S35 are controlled by a switch control pulse $\phi_1$. The switches S13 and S31 are controlled by a switch control pulse $\phi_2$. The switches S16, S17, S32 and S33 are controlled by a switch control pulse $\phi_3$. These switch control pulses $\phi_1$, $\phi_2$ and $\phi_3$ has a phase relationship shown in FIG. 7 and generated from a controller 53. Simultaneous low levels of the switch control pulses $\phi_1$, $\phi_2$ and $\phi_3$ are prohibited. All the switches S13 to S17 and S31 to S35 are formed of P- and N-channel MOS FET's connected as shown in FIG. 2(b).

The output voltage obtained across the primary winding of the transformer T1 is precisely determined, as explained in connection with the third preferred embodiment of FIG. 4. Furthermore, since the first and second switching circuits 170 and 180 have two output terminals, respectively, the polarity of the output voltage obtained across the load impedance Z1 may be controlled between voltages +V0 and −V0 (where V0 is a voltage determined by a winding ratio of the transformer T1) and a zero volt by controlling the switch control pulses $\phi_1$ and $\phi_3$ during a period when the switches S13 and S31 are turned off with the switch control pulse $\phi_2$. Namely, under a condition where the switches S13 and S31 turn off, a high level of the switch control pulse $\phi_1$ and a low level of the switch control pulse $\phi_3$ produce the voltage of the input reference voltage V1 at the one end 51 of the primary winding of the transformer T1, while the other end 52 held at a grounding potential, causing the voltage +V0 across the load impedance Z1. Under the same condition, a low level of the switch control pulse $\phi_1$, and a high level of the switch control pulse $\phi_3$ produce the voltage of the input reference voltage V1 and the grounding potential at the end 52 and the end 51, respectively, to produce the voltage −V0 across the load impedance 21. On the other hand, under a condition where both switches S13 and S31 turn on by a high level of the switch control pulse $\phi_2$, low levels of both the switch control pulses $\phi_1$ and $\phi_3$ make both ends 51 and 53 floating to produce zero volt across the load impedance 21.

As above-explained, since switches are included in a feedback loop, the output voltage obtained at a load is substantially determined by resistances of resistors in the feedback loop. This feature can be equally obtained, irrespective of transistor size used as the switches. Accordingly, the switching circuit of the present invention can be formed in a semiconductor integrated circuit having a small area chip.

What is claimed is:
1. A switching circuit comprising:
first and second input terminals;
first and second output terminals;
a first amplifier having a first non-inverting input node connected to said first input terminal, a first inverting input node and a first output node;
a first switch inserted between said first output node and said first inverting input node;
a second switch inserted between said first output node and said first output terminal;
a third switch inserted between said first output terminal and said first inverting input node;
a second amplifier having a second non-inverting input node connected to said second input terminal, a second inverting input node and a second output node;
a fourth switch inserted between said second output node and said second inverting input node;
a fifth switch inserted between said second output node and said second output terminal;
a sixth switch inserted between said second output terminal and said second inverting input node;
a load connected between said first and second output terminals; and
a controller controlling said first to sixth switches in a condition that on and off of said first and fourth switches are in opposite to said second, third, fifth and sixth switches.

2. A switching circuit as claimed in claim 1, wherein said first to sixth switches are respectively formed of P- and N-channel field effect transistors having source, drain and gate electrodes, paths between said source and drain electrodes of said P- and N-channel field effect transistors being connected in parallel with each other.

3. A switching circuit comprising:
   first and second input terminals;
   first and second output terminals;
   a first amplifier having a first non-inverting input node connected to said first input terminal, a first inverting input node and a first output node;
   a first switch inserted between said first output node and said first inverting input node;
   a second switch inserted between said first output node and said first output terminal;
   a third switch inserted between said first output terminal and said first inverting input node;
   a fourth switch inserted between said first output node and said second output terminal;
   a fifth switch inserted between said second output terminal and said first inverting input node;
   a second amplifier having a second non-inverting input node connected to said second input terminal, a second inverting input node and a second output node;
   a sixth switch inserted between said second output node and said second inverting input node;
   a seventh switch inserted between said second output node and said second output terminal;
   an eighth switch inserted between said second output terminal and said second inverting input node;
   a ninth switch inserted between said second output node and said first output terminal;
   a tenth switch inserted between said first output terminal and said second inverting input node;
   a load connected between said first and second output terminals; and
   a controller producing first switch control pulses for controlling said second, third, seventh and eighth switches, second switch control pulses for controlling said first and sixth switches and third switch control pulses for controlling said fourth, fifth, ninth and tenth switches, said first and third switch control pulses being generated when said second switch control pulses are not generated.

4. A switching circuit as claimed in claim 3, wherein said first to tenth switches are respectively formed of P- and N-channel field effect transistors having sources, drain and gate electrodes, paths between said source and drain electrodes of said P- and N-channel field effect transistors being connected in parallel with each other.

* * * * *